United States Patent
Shiimoto et al.

(10) Patent No.: US 8,446,756 B2
(45) Date of Patent: May 21, 2013

(54) METHOD OF STABILIZING DATA HOLD OPERATIONS OF A STORAGE DEVICE

(75) Inventors: Tsunenori Shiimoto, Kanagawa (JP); Nobumichi Okazaki, Nagasaki (JP); Tomohito Tsushima, Tokyo (JP)

(73) Assignee: Sony Corporation, Tokyo (JP)

( * ) Notice: Subject to any disclaimer, the term of this patent is extended or adjusted under 35 U.S.C. 154(b) by 240 days.

(21) Appl. No.: 12/671,939

(22) PCT Filed: Aug. 12, 2008

(86) PCT No.: PCT/JP2008/064448
§ 371 (c)(1),
(2), (4) Date: Feb. 3, 2010

(87) PCT Pub. No.: WO2009/022693
PCT Pub. Date: Feb. 19, 2009

(65) Prior Publication Data
US 2011/0026298 A1    Feb. 3, 2011

(30) Foreign Application Priority Data
Aug. 15, 2007  (JP) ................................ P2007-211733

(51) Int. Cl.
*G11C 11/00* (2006.01)
(52) U.S. Cl.
USPC .......................................................... 365/163
(58) Field of Classification Search
USPC ............................................. 365/163 O, 163
See application file for complete search history.

(56) References Cited

U.S. PATENT DOCUMENTS

| | | | |
|---|---|---|---|
| 6,750,469 B2 * | 6/2004 | Ichihara et al. ................... 257/2 |
| 7,082,051 B2 * | 7/2006 | Ha et al. ........................ 365/163 |
| 2005/0226036 A1 | 10/2005 | Aratani et al. |
| 2009/0052225 A1 | 2/2009 | Morimoto |

FOREIGN PATENT DOCUMENTS

| | | |
|---|---|---|
| JP | 2002-537627 | 11/2002 |
| JP | 2004-363604 | 12/2004 |
| JP | 2005-197634 | 7/2005 |
| JP | 2005-216387 | 8/2005 |
| JP | 2005-347468 | 12/2005 |
| JP | 2008-052867 | 3/2006 |
| JP | 2006-202411 | 8/2006 |
| JP | 2006-203098 | 8/2006 |
| JP | 2007-294592 | 11/2007 |
| WO | 0049659 | 8/2000 |
| WO | 2008-059701 | 5/2008 |

OTHER PUBLICATIONS

Nikkei Electronics Nov. 18, 2002 P130.
International Search Report (PCT/JP2008/064448) dated Nov. 18, 2008.

* cited by examiner

*Primary Examiner* — Vanthu Nguyen
(74) *Attorney, Agent, or Firm* — K&L Gates LLP

(57) ABSTRACT

Provided is a method of driving a storage device capable of improving reliability of data write in the storage device including a variable resistance element. At the time of data write operation, a plurality of write pulses having shapes different from each other are applied between electrodes 21 and 24 in a variable resistance element 2. Diffusion loss of a conductive path caused by self-heat generation (generation of Joule heat) of the variable resistance element 2 may be prevented, and thus data hold operation after write is stabilized. Also, the variable resistance element 2 may be prevented from being destructed when the write operation is sufficiently performed, and thus the data write operation is stabilized.

14 Claims, 6 Drawing Sheets

METHOD OF STABILIZING DATA HOLD OPERATIONS OF A STORAGE DEVICE

CROSS REFERENCE TO RELATED APPLICATIONS

The present application is a national stage of International Application No. PCT/JP2008/064448 filed on Aug. 12, 2008 and claims priority to Japanese Patent Application No. 2007-211733 filed on Aug. 15, 2007, the disclosures of which are incorporated herein by reference.

BACKGROUND

The present invention relates to a method of driving a storage device when a variable resistance element is changed from a high resistance state to a low resistance state (write operation) in the storage device in which a memory cell is composed of a nonvolatile variable resistance element.

An existing storage device, in particular, a storage device using a flash memory has been actively used in recent years, since the electric power for holding storage data is unnecessary. In particular, in a portable terminal device including a cell-phone unit, a flash memory has been widely used as a memory. However, in a storage device using such a flash memory, there is an issue that the data write speed is slow (for example, refer to Non-patent Document 1).

Thus, the applicant has proposed a storage device using a nonvolatile variable resistance element which may have characteristics superior to those of the above-described flash memory (for example, Patent Document 1). This variable resistance element has a stacked structure including a pair of electrodes with a conductive film and an insulating film in between. And, when a voltage is applied between the pair of electrodes so that a current flows from the conductive film to the insulating film, the variable resistance element is changed to the low resistance state, and data is written. On the other hand, when a voltage is applied between the pair of electrodes so that a current reversely flows from the insulating film to the conductive film, the variable resistance element is changed to the high resistance state, and data is erased.

Since the variable resistance element of such a configuration may constitute a memory cell having a simple structure in comparison with the above-described flash memory, there is no size dependency of the element, and a large signal may be obtained. Thus, the variable resistance element has characteristics resistant to scaling. Also, the variable resistance element has advantages that the data write speed by the resistance change may be accelerated to, for example, approximately 5 nanosecond, and, moreover, is operable with a low voltage (for example, approximately 1 V), and a low current (for example, approximately 20 µA).

Non-patent Document 1: Nikkei Electronics, 2002. 11. 18, p.130
Patent Document 1: Japanese Unexamined Patent Publication No. 2005-197634

SUMMARY

However, in this variable resistance element, depending on the configuration of and a method of manufacturing the insulating film and the conductive film, there is a case where the variation of the resistance is large in the low resistance state after write. And, when the variation of the resistance is large in this manner, it is difficult to stably hold the written data.

Moreover, to sufficiently perform write so as to prevent generation of write error or the like, it is necessary to increase a voltage applied to the variable resistance element, increase a current flowing therethrough, and increase the application time of the voltage. However, when a voltage unnecessarily high is applied to the variable resistance element, or a high current is flown too much, there is a case where the insulating film causes dielectric breakdown, and the variable resistance element itself is destructed.

In this manner, in the existing storage device, it is difficult to stably write and hold the data, and thus it is difficult to enhance reliability. There has been room for improvement.

In view of the foregoing, it is an object of the present invention to provide a method of driving a storage device capable of improving reliability of data write in the storage device including a variable resistance element.

A method of driving a storage device of the present invention is applied to a storage device including a variable resistance element which includes a pair of electrodes, and in which a resistance value is reversibly changed by applying voltages having polarities different from each other between the pair of electrodes. A plurality of pulse voltages having shapes different from each other are applied between the pair of electrodes, when the variable resistance element is changed from a high resistance state in which a resistance value is high to a low resistance state in which a resistance value is low. Here, "pulse voltage" is not limited to a voltage with a pulse waveform in a literal sense, but includes, for example, a voltage with a ramp waveform.

In the method of driving a storage device of the present invention, when the voltages are applied between the pair of electrodes in the variable resistance element, a conductive path is formed between the pair of electrodes, and a current flows. Thereby, the variable resistance element is changed from the high resistance state to the low resistance state, and data is written. Here, at the time of such data write operation (when changing from the high resistance state to the low resistance state), the plurality of pulse voltages having shapes different from each other are applied between the pair of electrodes, and thus it is possible to prevent diffusion loss of the conductive path caused by self-heat generation of the variable resistance element. Also, the variable resistance element may be prevented from being destructed when the write operation is sufficiently performed.

In the method of driving a storage device of the present invention, two pulse voltages having shapes different from each other may be applied between the pair of electrodes, when the variable resistance element is changed from the high resistance state to the low resistance state. In this case, in the two pulse voltages, a voltage value of a second pulse voltage may be set to be lower than a voltage value of a first pulse voltage. In the case of such a configuration, after the data write operation is performed with the first write pulse voltage, the self-heat generation of the variable resistance element is suppressed with the second pulse voltage having the lower voltage value, and it is possible to prevent the diffusion loss of the conductive path caused by a non-bias state between the pair of electrodes. Therefore, the resistance value of the variable resistance element in the low resistance state after the write operation is stabilized, and written data is stably held.

Also, in the case where the two pulse voltages having shapes different from each other are applied as described above, in the two pulse voltages, the voltage value of the second pulse voltage may be set to be higher than the voltage value of the first pulse voltage. In the case of such a configuration, after the variable resistance element becomes a soft-breakdown state with the first pulse voltage having the lower voltage value, the conductive path in a sufficient amount is formed with the second pulse voltage having the higher voltage value. Thus, the write operation is sufficiently performed. Accordingly, generation of error at the time of the write operation (write error) is suppressed while destruction and deterioration of the variable resistance element are prevented, and it is possible to stably perform the write operation.

According to the method of driving the storage device of the present invention, at the time of the data write operation (when changing from the high resistance state to the low resistance state), the plurality of pulse voltages having shapes different from each other are applied between the pair of electrodes, and thus it is possible to prevent the diffusion loss of the conductive path caused by the self-heat generation of the variable resistance element, and prevent the variable resistance element from being destructed when the write operation is sufficiently performed. Therefore, it is possible to stabilize the data write operation and data hold operation, and it is possible to improve reliability of the data write operation.

Additional features and advantages of the present invention are described in, and will be apparent from, the following Detailed Description and the Figures.

BRIEF DESCRIPTION OF FIGURES

FIG. 1 is a circuit view illustrating a configuration example of a memory cell to which a method of driving a storage device according to a first embodiment of the present invention is applied.

FIG. 2 is a cross-sectional view illustrating a detailed configuration example of a variable resistance element illustrated in FIG. 1.

FIG. 3 is a cross-sectional view for explaining action of the variable resistance element at the time of write operation and erase operation.

FIG. 4 is a timing waveform diagram for explaining a method of driving a storage device according to a comparative example.

FIG. 5 is a characteristic view illustrating an example of the relationship between resistance value of a variable resistance element according to the comparative example, and the number of writes.

FIG. 6 is a timing waveform diagram for explaining the method of driving the storage device according to the first embodiment.

FIG. 7 is a characteristic view illustrating the relationship between the resistance value of the variable resistance element according to an example and the number of writes.

FIG. 8 is a timing waveform diagram for explaining the method of driving the storage device according to the second embodiment.

DETAILED DESCRIPTION

A description will be hereinafter made in detail on embodiments of the present invention with reference to the drawings.

[First Embodiment]

Figure 1:
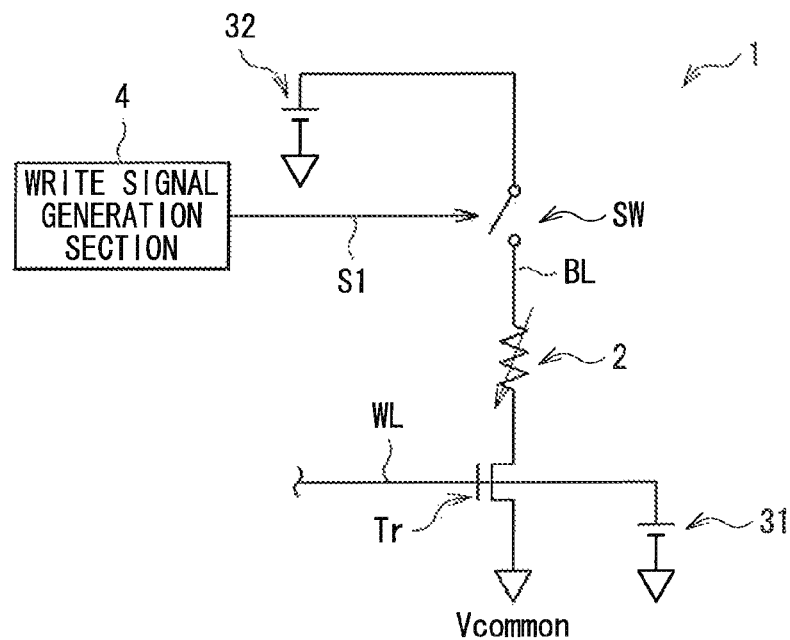
[FIG. 1]

FIG. 1 illustrates a circuit configuration example of a memory cell 1 in a storage device to which a method of driving a storage device according to a first embodiment of the present invention is applied. This memory cell 1 includes a variable resistance element 2, a selection transistor Tr, a gate voltage power supply 31, a switch SW, a write voltage power supply 32, and an erase voltage power supply (not illustrated in the figure). In addition, a plurality of the memory cells 1 having such a configuration are arranged, for example, in a matrix form, and thereby the storage device (memory) is configured.

The variable resistance element 2 includes a pair of electrodes which will be described later, and is configured so that the resistance value is reversibly changed by applying voltages of different polarities (a write voltage and an erase voltage which will be described later) between the pair of electrodes. In addition, a detailed configuration of this variable resistance element 2 will be described later.

In the selection transistor Tr, a gate is connected to a selection word line WL, a source is connected to a common voltage terminal Vcommon, and a drain is connected to one end of the variable resistance element 2 (on an electrode 24 side which will be described later). Also, one end of the selection word line WL is connected to the gate voltage power supply 31. With such a configuration, a gate voltage from the gate voltage power supply 31 is supplied to the selection transistor Tr at the time of data write or data erase, and the selection transistor Tr is turned on.

The switch Sw is inserted and disposed in a bit line BL connecting between the other end of the variable resistance element 2 (on an electrode 21 side which will be described later), and the write voltage power supply 32. Also, to the switch SW, a write signal 51 is supplied from a write signal generation section 4. With such a configuration, when the switch SW is turned on in response to the write signal 51, the write voltage from the write voltage power supply 32 is supplied to the variable resistance element 2. Thereby, the write voltage is applied between the pair of electrodes in the variable resistance element 2, and a write current Iw which will be described later flows between the pair of electrodes.

Figure 2:
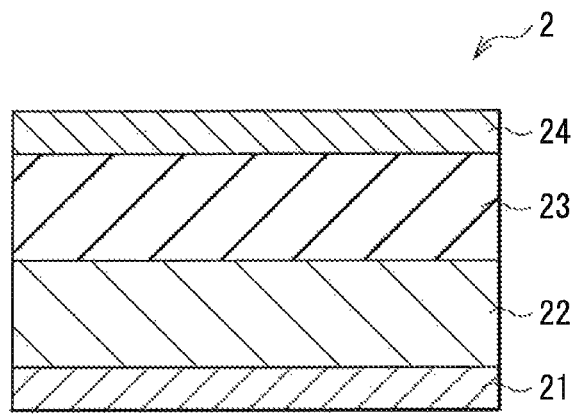
[FIG. 2]

Next, with reference to FIG. 2, the detailed configuration of the variable resistance element 2 will be described. FIG. 2 illustrates a detailed configuration example of the variable resistance element 2.

This variable resistance element 2 has a stacked structure in which a conductive film 22 and an insulating film 23 are stacked in this order from the electrode 21 side between the pair of electrodes 21 and 24.

The electrodes 21 and 24 are electrodes to which the write voltage and the erase voltage having polarities different from each other are applied through the bit line BL, and composed of a material such as aluminum (Al), copper (Cu), or tungsten (W).

The conductive film 22 contains a metal element which is easily ionized, and corresponds to a specific example of "metal containing layer" of the present invention. Examples of such a metal element include at least one of copper (Cu), silver (Ag), and zinc (Zn). With such a configuration, the conductive film 22 has a property that the metal element therein is ionized and pulled to the cathode side (the electrode 24 side), when the write voltage is applied between the electrodes 21 and 24. In addition, a metal element other than Cu, Ag, and Zn which have been described above may be used, as long as the metal element is easily ionized. Also, an example of the conductive film 22 includes a CuTe (tellurium) film formed in a thickness of approximately 20 nm.

The insulating film 23 functions as a storage layer storing and holding written data, and is composed of, for example, an insulating material such as amorphous gadolinium oxide ($Gd_2O_3$) and silicon oxide ($SiO_2$). In addition, an example of such an insulating film 23 includes an amorphous $Gd_2O_3$ film formed in a thickness of approximately 5 nm.

Next, with reference to FIGS. 3 to 7 in addition to FIGS. 1 and 2, the method of driving the storage device of this embodiment (in particular, a data write method) will be described.

First, with reference to FIGS. 1 to 3, basic operation of the method of driving the storage device (basic operation of the data write method and a data erase method) will be described in detail.

Figure 3A:
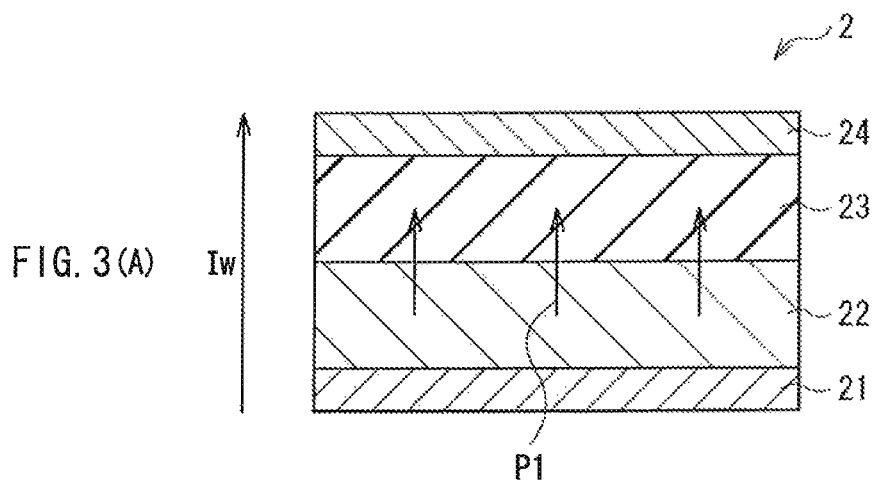
[FIG. 3]

First, at the time of data write, as illustrated in FIG. 3(A), the write voltage to set the electrode 24 on the insulating film 23 side to have low potential is applied between the electrodes 21 and 24 from the write voltage power supply 32 through the switch SW and the bit line BL. Thereby, as indicated by arrow P1 in the figure, ions in the metal element in the conductive film 22 are pulled to the electrode 24 side, and enter inside the insulating film 23. And, when the ions reach the electrode 24, a conductive path (conductive path) not illustrated in the figure is formed between the electrodes 21 and 24, and electrical conduction is established between the electrodes 21 and 24. As illustrated in the figure, the write current Iw flows from the electrode 21 to the electrode 24, and thereby the resistance value of the variable resistance element 2 is decreased (changes from the high resistance state to the low resistance state). In this manner, data (information) is written on the variable resistance element 2.

Figure 3B:
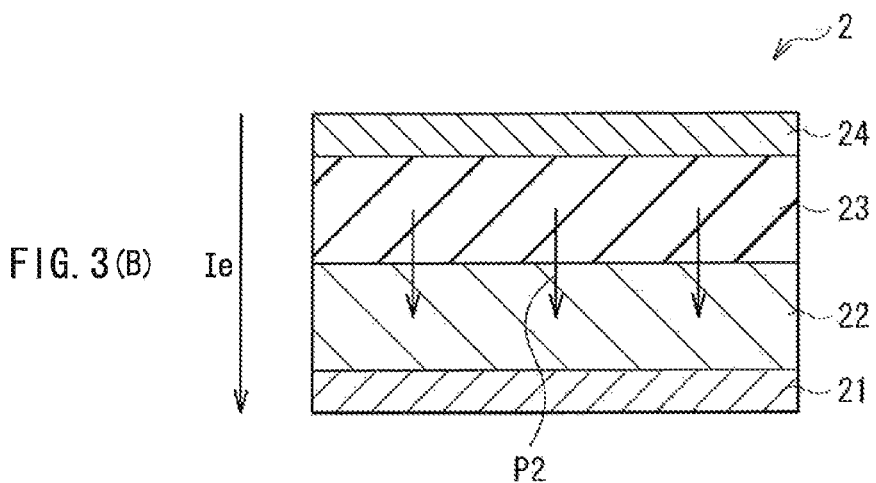

On the other hand, at the time of erase of written data, as illustrated in FIG. 3(B), the erase voltage to set the electrode 21 on the conductive film 22 side to have low potential is applied between the electrodes 21 and 24 from the erase voltage power supply not illustrated in the figure through the bit line BL. Thereby, as indicated by arrow P2 in the figure, the metal element in the insulating film 23 is ionized and pulled to the electrode 21 side, and exits from the insulating film 23. Thus, the conductive path formed between the electrodes 21 and 24 becomes small. As illustrated in the figure, an erase current Ie flows from the electrode 24 to the electrode 21, and thereby the insulation properties between the electrodes 21 and 24 are improved, and the resistance value of the variable resistance element 2 is increased (changes from the low resistance state to the high resistance state). In this manner, data (information) is erased from the variable resistance element 2.

In addition, as described above, by repeating application of the voltages having polarities different from each other between the electrodes 21 and 24, it is possible to reversibly change the resistance value of the variable resistance element 2 between the high resistance state and the low resistance state. Further, since the resistance value of the insulating film 23 changes according to the amount of ions in the metal element in the insulating film 23, this insulating film 23 functions as the storage layer, as described before.

Figure 4:
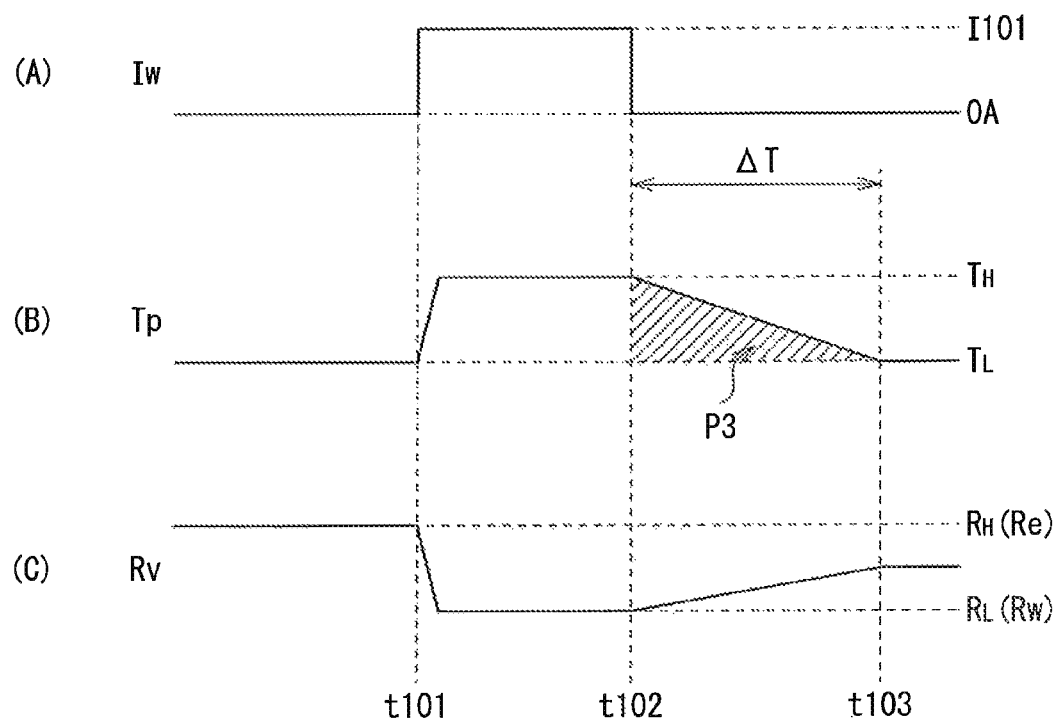
[FIG. 4]
Figure 5:
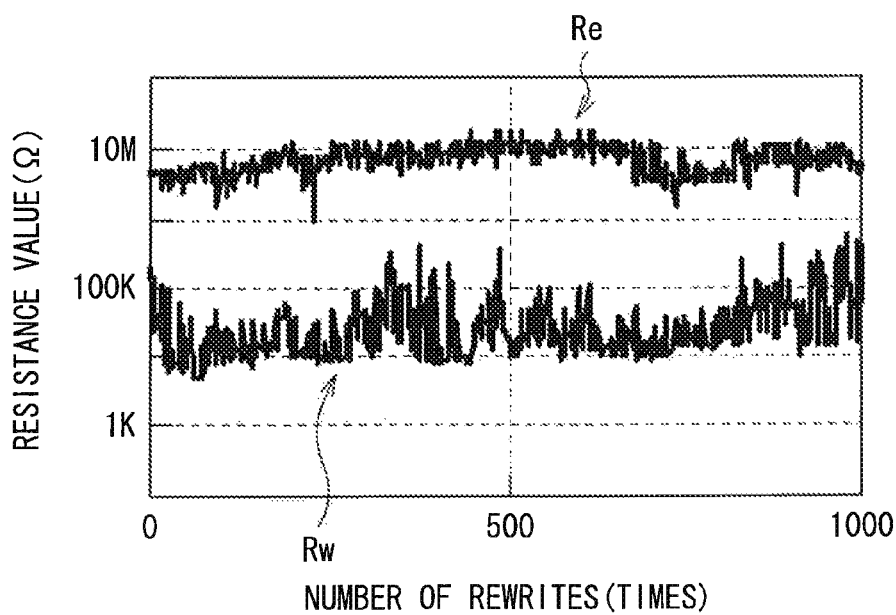
[FIG. 5]

Next, with reference to FIGS. 1, 2, and 4 to 7, the method of driving the storage device (data write method), which corresponds to the characteristic part of the present invention, will be described in detail while comparing with a comparative example. Here, FIGS. 4 and 5 illustrate the existing data write method according to the comparative example, FIG. 4 illustrates the timing waveform at the time of data write operation (FIG. 4(A) illustrates the write current Iw, FIG. 4(B) illustrates a temperature Tp of the conductive path not illustrated in the figure, and FIG. 4(C) illustrates a resistance value Rv of the variable resistance element 2, respectively), and FIG. 5 illustrates an example of the relationship between the number of data rewrites (the repeated number of data writes and erases), and the resistance value of the variable resistance element 2 (a resistance value Rw after write, and a resistance value Re after erase). Also, FIGS. 6 and 7 illustrate an example of the data write method according to this embodiment (the data write method according to an example), FIG. 6 illustrates the timing waveform at the time of data write operation (FIG. 6(A) illustrates the write current Iw, FIG. 6(B) illustrates a temperature Tp of the conductive path not illustrated in the figure, and FIG. 6(C) illustrates a resistance value Rv of the variable resistance element 2, respectively), and FIG. 7 illustrates an example of the relationship between the number of data rewrites (the repeated number of data writes and erases), and the resistance value of the variable resistance element 2 (a resistance value Rw after write, and a resistance value Re after erase).

In addition, in the comparative example illustrated in FIGS. 4 and 5, a current of 200 μA and a voltage of 3 V having a pulse width of 100 ns (nanoseconds) are used as a write pulse (a pulse current or a pulse voltage), and a voltage of 2 V having a pulse width of 100 ns is used as an erase pulse (a pulse current or a pulse voltage).

First, in the data write method according to the comparative example, for example, as illustrated in FIG. 4, the pulse write voltage is applied and the pulse write current Iw (FIG. 4(A)) flows between the electrodes 21 and 24 during a period between a timing t101 and a timing t102. Thereby, the conductive path between the electrodes 21 and 24 is formed so that the resistance value Rv (FIG. 4(C)) of the variable resistance element 2 is decreased from the resistance value RH (the resistance value Re after erase) to the resistance value RL (the resistance value Rw after write), and Joule heat is generated in the conductive path by this write current Iw so that the temperature Tp of the conductive path is increased (FIG. 4(B)). Here, even after application of the write pulse (the pulse write voltage and the pulse write current) is finished at the timing t102, since the temperature Tp of the conductive path is not decreased immediately (as indicated by reference numeral P3 in the figure, the temperature Tp is decreased to a temperature TL at the timing t103), the conductive path becomes a high temperature (temperature TH) state in a non-bias state during a certain period ΔT after application of the write pulse is finished. Therefore, metal ions and atoms forming the conductive path are thermally diffused. Thus, as illustrated in FIG. 5, the resistance value Re after erase is relatively stabilized, while the resistance value Rw after write is largely changed, and becomes unstable. And, when the variation of the resistance value of the variable resistance element 2 is large in this manner, it is difficult to stably hold the written data.

Figure 6:
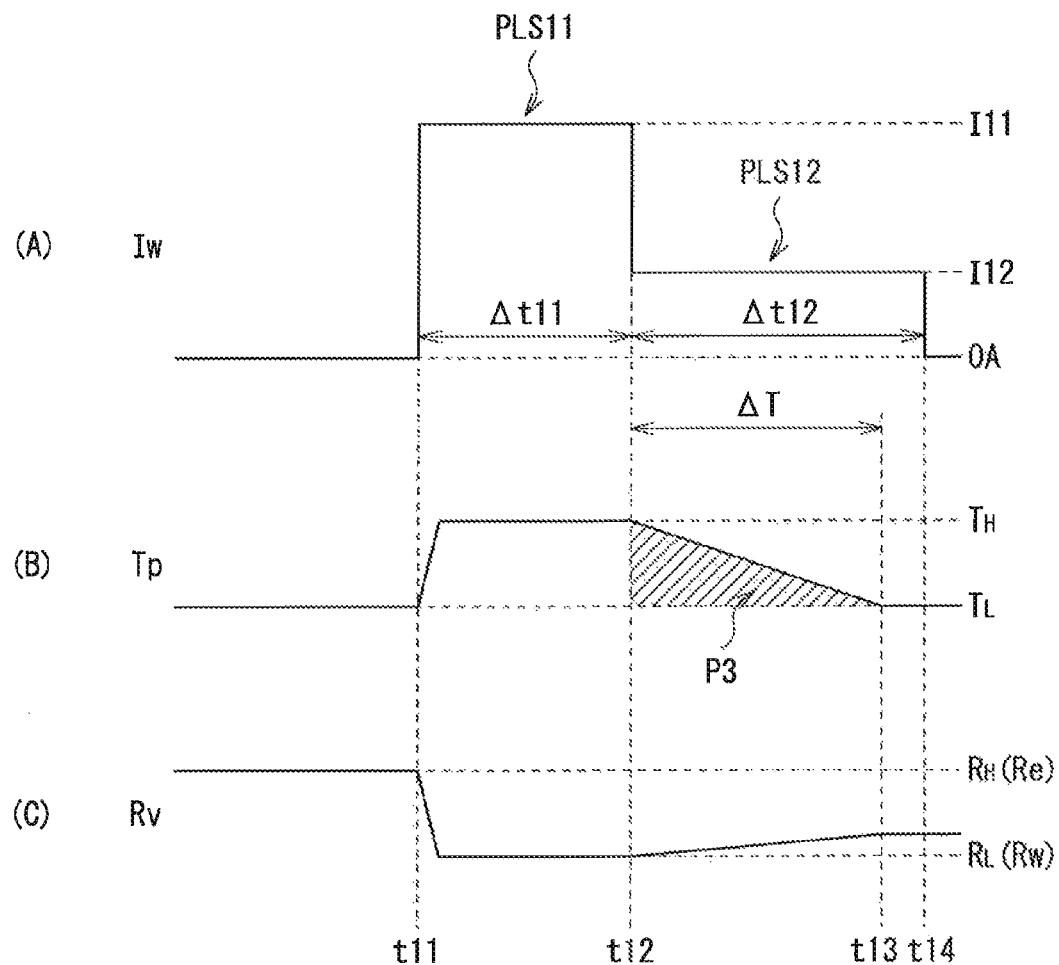
[FIG. 6]
Figure 7:
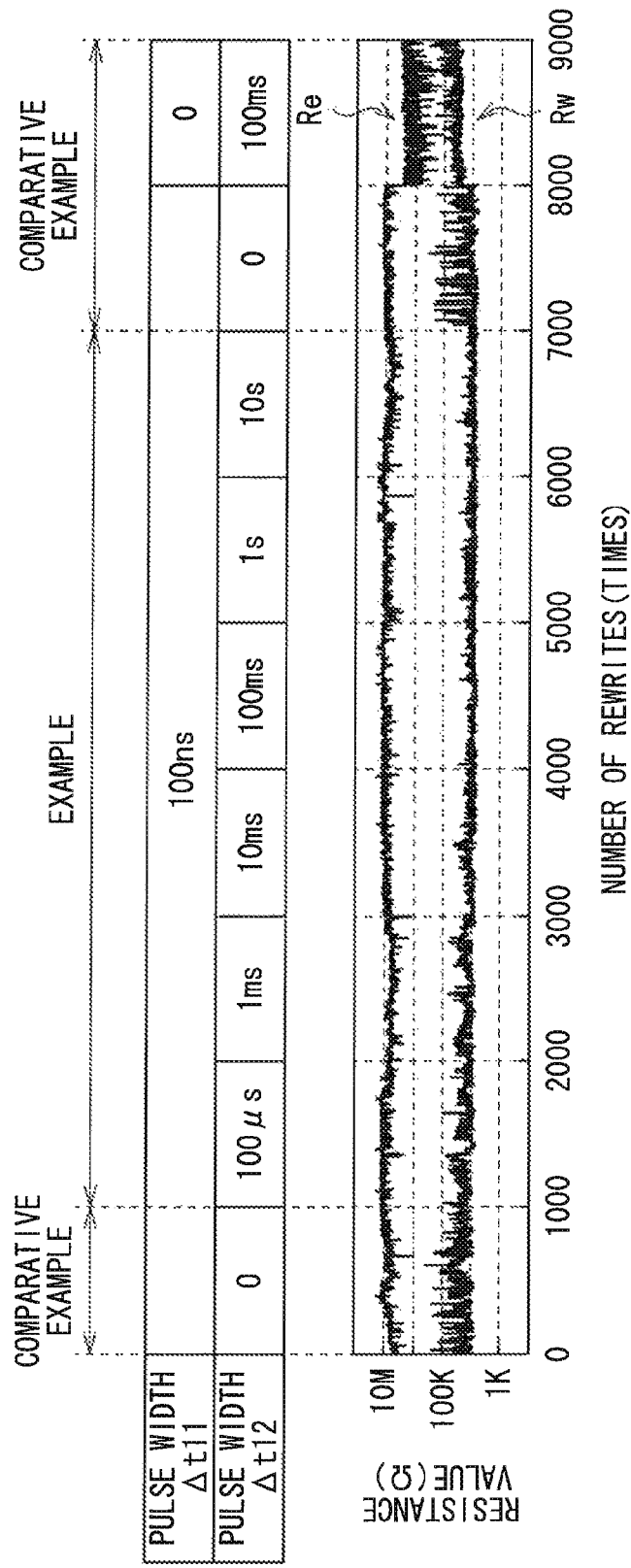
[FIG. 7]

On the other hand, in the data write method according to the example, for example, as illustrated in FIG. 6, at the time of the data write operation (period between the timing t11 and the timing t14), a plurality of (here, two) the pulse write voltages different from each other are applied between the electrodes 21 and 24 in response to the write signal Si supplied from the write signal generation section 4, and a plurality of (here, two) the pulse write currents Iw (FIG. 6(A)) different from each other flow (two write pulses PLS11 and PLS12 having pulse widths Δt11 and Δt12 are applied). Also, in such two write pulses PLS11 and PLS12, a voltage value and a current value (current value I12) of the second write pulse PLS12 are set to be lower than a voltage value and a current value (current value I11) of the first write pulse PLS11. Further, at the time of such data write operation, the temperature Tp of the conductive path formed between the electrodes 21 and 24 is decreased to a temperature equal to or lower than a predetermined threshold (for example, a temperature TL) (here, the timing t13), and after that (here, the timing 14) the voltage value and the current value of the second write pulse PLS12 are set to be off. Thereby, after the data write operation is performed with the first write pulse PLS11, self-heat generation (generation of Joule heat) of the variable resistance element 2 is suppressed with the second write pulse PLS12 having the lower voltage value and the lower current value (current value I12), and it is possible to prevent diffusion loss of the conductive path caused by the non-bias state between the electrodes 21 and 24. Therefore, the resistance value of the variable resistance element 2 in the low resistance state after the write operation is stabilized, and the written data is stably held.

As an example, in the example (including the comparative example) illustrated in FIG. 7, the first write current Iw is 200 μA, the second write current Iw is 25 μA, and the pulse width Δt12 is changed every 1000 data rewrites. Specifically, when the number of data rewrites is between 1 and 1000 (comparative example), the pulse width Δt11 of the first write pulse PLS11 is 100 ns, and the pulse width Δt12 of the second write pulse PLS12 is 0, resulting that the write pulse is only once. Also, when the number of data rewrites is between 1001 and 2000 (example), the pulse width Δt11 of the first write pulse PLS11 is 100 ns, and the pulse width Δt12 of the second write pulse PLS12 is 100 μs. When the number of data rewrites is between 2001 and 3000 (example), the pulse width Δt11 of the first write pulse PLS11 is 100 ns, and the pulse width Δt12 of the second write pulse PLS12 is 1 ms. When the number of data rewrites is between 3001 and 4000 (example), the pulse width Δt11 of the first write pulse PLS11 is 100 ns, and the pulse width Δt12 of the second write pulse PLS12 is 10 ms. When the number of data rewrites is between 4001 and 5000 (example), the pulse width Δt11 of the first write pulse PLS11 is 100 ns, and the pulse width Δt12 of the second write pulse PLS12 is 100 ms. When the number of data rewrites is between 5001 and 6000 (example), the pulse width Δt11 of the first write pulse PLS11 is 100 ns, and the pulse width Δt12 of the second write pulse PLS12 is 1 s. When the number of data rewrites is between 6001 and 7000 (example), the pulse width Δt11 of the first write pulse PLS11 is 100 ns, and the pulse width Δt12 of the second write pulse PLS12 is 10 s. Also, when the number of data rewrites is between 7001 and 8000 (comparative example), the pulse width Δt11 of the first write pulse PLS11 is 100 ns, and the pulse width Δt12 of the second write pulse PLS12 is 0, resulting that the write pulse is only once. Also, when the number of data rewrites is between 8001 and 9000 (comparative example), the pulse width Δt11 of the first write pulse PLS11 is 0, and the pulse width Δt12 of the second write pulse PLS12 is 100 ms, resulting that the write pulse is only once. In addition, as the erase pulse, a voltage of 2 V having a pulse width of 100 ns is used.

In the example where the two write pulses PLS11 and PLS12 different from each other are applied (the number of data writes is between 1001 and 7000), it can be seen from FIG. 7 that self-heat generation (generation of Joule heat) of the variable resistance element 2 is suppressed, and diffusion loss of the conductive path caused by the non-bias state between the electrodes 21 and 24 may be prevented, thereby the resistance value Rw after write is stabilized. On the other hand, in the comparative example where only one write pulse is applied, when the number of data writes is between 1 and 1000, and when the number of data writes is between 7001 and 8000, due to the diffusion loss of the conductive path caused by the self-heat generation of the variable resistance element 2, the resistance value Rw after write becomes unstable. In addition, in the comparative example, when the number of data writes is between 8001 and 9000, the first write pulse does not exist, and only the second write pulse exists. Thus, after all, the write is not sufficiently performed.

As described above, in this embodiment, at the time of the data write operation (when changing from the high resistance state to the low resistance state), the plurality of write pulses having shapes different from each other are applied between the electrodes 21 and 24 in the variable resistance element 2, and thereby it is possible to prevent the diffusion loss of the conductive path caused by the self-heat generation (generation of Joule heat) of the variable resistance element 2. Therefore, it is possible to stabilize data hold operation after write, and it is possible to improve reliability of the data write operation.

Specifically, at the time of the data write operation, the two write pulses PLS11 and PLS12 having shapes different from each other are applied between the electrodes 21 and 24, and, in the two write pulses PLS11 and PLS12, the voltage value and the current value of the second write pulse PLS12 are set to be lower than the voltage value and the current value of the first write pulse. Thus, after the data write operation is performed with the first write pulse PLS11, the self-heat generation (generation of Joule heat) of the variable resistance element 2 is suppressed with the second write pulse PLS12 having the lower voltage value and the lower current value (current value I12), and it is possible to prevent the diffusion loss of the conductive path caused by the non-bias state between the electrodes 21 and 24. Therefore, the resistance value of the variable resistance element 2 in the low resistance state after the write operation is stabilized, and it is possible to stably hold the written data.

Also, at the time of the data write operation, after when the temperature Tp of the conductive path formed between the electrodes 21 and 24 is decreased to a temperature equal to or lower than the predetermined threshold (for example, the temperature TL), the voltage value and the current value of the second write pulse PLS12 are set to be off. Thus, it is possible to surely prevent the diffusion loss of the conductive path caused by the self-heat generation (generation of Joule heat) of the variable resistance element 2 as described above.

[Second Embodiment]

Next, a second embodiment of the present invention will be described. In addition, same reference numerals are used to indicate components identical to those in the first embodiment, and thereby the description is appropriately omitted.

Figure 8:
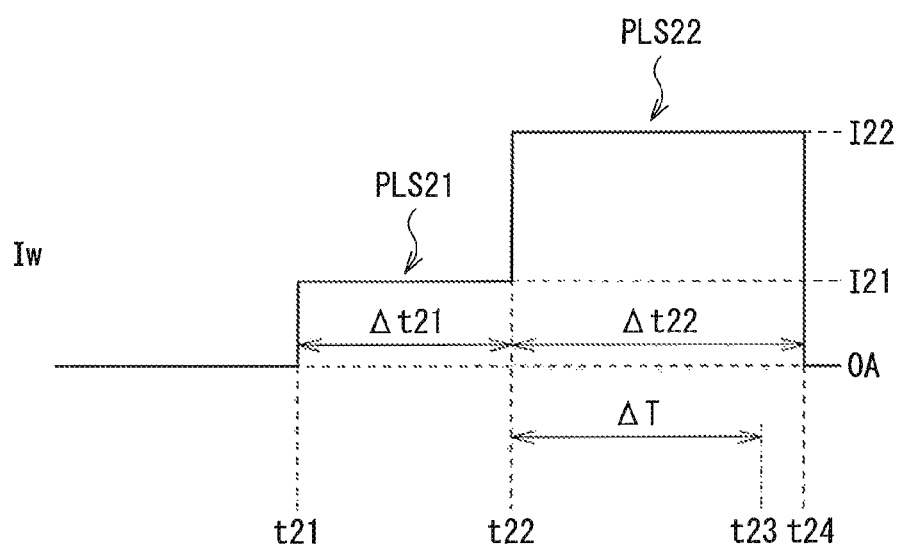
[FIG. 8]

FIG. 8 illustrates an example of the data write method according to this embodiment, and specifically illustrates the timing waveform at the time of the data write operation. In addition, the storage device to which the data write method according to this embodiment is applied is the same as that described in the first embodiment, and thereby the description is omitted.

Here, first, before describing the data write method of this embodiment, the data write operation will be studied in detail. It is considered that this data write operation is configured with two steps. Fist, in the first step, the write voltage is applied between the electrodes 21 and 24 in the high resistance state of insulation properties, and soft-breakdown is generated in a certain weak portion in the insulating film 23, thereby a leak current flows. And, in the second step, ionization of metal atoms in the conductive film 22 is promoted by Joule heat generated with this leak current, and metal ions travel with the write voltage, thereby a low-resistance conductive path is formed between the electrodes 21 and 24.

Here, when the applied write voltage is too high in the first step, hard-breakdown is generated, and the variable resistance element 2 is half destroyed. Also, even if hard-breakdown is not substantially generated, when the applied voltage is too high and the leak current is increased too much in the first step, deterioration of the variable resistance element 2 is accelerated. On the other hand, to form a sufficiently stable conductive path between the electrodes 21 and 24, by flowing a relatively high current or applying a relatively high voltage, it is necessary that the metal ions in a sufficient amount travel in the insulating film 23 to form a sufficient conductive path.

Thus, in the data write method of this embodiment, for example, as illustrated in FIG. 8, at the time of the data write operation (period between the timing t21 and the timing t24), first, in the same manner as the first embodiment, the plurality of (here, two) pulse write voltages different from each other are applied between the electrodes 21 and 24 in response to the write signal Si supplied from the write signal generation section 4, and the plurality of (here, two) pulse write currents Iw different from each other flow (two write pulses PLS21 and PLS22 having pulse widths Δt21 and Δt22 are applied). Also, in such two write pulses PLS21 and PLS22, the voltage value and the current value (current value I22) of the second write pulse PLS22 are set to be higher than the voltage value and the current value (current value I21) of the first write pulse PLS21, and the pulse width Δt22 of the second write pulse PLS22 is set to be larger than the pulse width Δt21 of the first write pulse PLS21.

With such a configuration, after the variable resistance element 2 becomes the soft-breakdown state with the first write pulse PLS21 having the lower voltage value and the low current value (current value I21), the conductive path in a sufficient amount is formed with the second write pulse PLS22 having the higher voltage value and the higher current value (current value I22). Thus, the write operation is sufficiently performed. Accordingly, generation of error at the time of the write operation (write error) is suppressed while destruction and deterioration of the variable resistance element 2 are prevented, and the write operation is stably performed.

As described above, in this embodiment, at the time of the data write operation (when changing from the high resistance state to the low resistance state), the plurality of write pulses having shapes different from each other are applied between the electrodes 21 and 24 in the variable resistance element 2, and thus it is possible to prevent destruction of the variable resistance element 2 caused when the write operation is sufficiently performed. Therefore, it is possible to stabilize the data write operation, and it is possible to improve reliability of the data write operation.

Specifically, at the time of the data write operation, the two write pulses PLS21 and PLS22 having shapes different from each other are applied between the electrodes 21 and 24, and, in the two write pulses PLS21 and PLS22, the voltage value and the current value of the second write pulse PLS22 are set to be higher than the voltage value and the current value of the first write pulse PLS21. Thus, after the variable resistance element 2 becomes the soft-breakdown state with the first write pulse PLS21 having the lower voltage value and the lower current value, the conductive path in the sufficient amount is formed with the second write pulse PLS22 having the higher voltage value and the higher current value. Thereby, the write operation is sufficiently performed. Accordingly, generation of error at the time of the write operation (write error) is suppressed while destruction and deterioration of the variable resistance element 2 are prevented, and it is possible to stably perform the write operation.

Also, in the two write pulses PLS21 and PLS22, the pulse width Δt22 of the second write pulse PLS22 is set to be larger than the pulse width Δt21 of the first write pulse PLS21. Thus, generation of error at the time of the write operation is suppressed while destruction and deterioration of the variable resistance element 2 are prevented, and it is possible to more stably perform the write operation.

Hereinbefore, the present invention has been described with the first embodiment and the second embodiment. However, the present invention is not limited to these embodiments, and various modifications may be made.

For example, in the above embodiments, the case where the time interval between the write pulses is 0 (zero) in the two write pulses PLS11 and PLS12, and the two write pulses PLS21 and PLS22 has been described. However, the time interval of a certain length may be provided between the two write pulses.

Also, in the above embodiments, the case where the two write pulses having shapes different from each other are applied between the electrodes 21 and 24 at the time of the data write operation (when changing from the high resistance state to the low resistance state) has been described. However, it is not limited to the case where the number of the write pulses to be applied is two, and the number may be three or more.

Also, in the above embodiments, as the method of controlling the write voltage and the write current, the method where the write voltage supplied from the write voltage power supply 32 is controlled has been described. However, for example, the write voltage supplied from the write voltage power supply 32 is fixed, and the gate voltage of the selection transistor Tr supplied from the gate voltage power supply 31 may be controlled. Further, both the control of the write voltage and the control of the gate voltage may be combined.

Also, in the above embodiments, the description has been made with the memory cell 1 in which one nonvolatile variable resistance element 2 is connected to one selection transistor Tr (so-called 1T-1R type memory cell). However, a storage device to which the drive method (write method) of the present invention is applied is not limited to a storage device including such a 1T-1R type memory cell. For example, it is possible to apply the drive method of the present invention to a storage device having a memory cell in which a plurality of nonvolatile variable resistance elements are connected to one selection transistor, a memory cell in which no selection transistor is provided, or the like.

Also, it is possible to apply the drive method (write method) of the present invention to a storage device including a variable resistance element which has a configuration different from the configuration of the variable resistance element 2 (FIGS. 1 and 2) described in the above embodiments. For example, it is possible to apply the drive method of the present invention to a storage device including a variable resistance element in which the stacking order of the conductive film 22 and the insulating film 23 is inverted in the cross-sectional configuration of FIG. 2, a variable resistance element in which the conductive film 22 also serves as the electrode 21, a variable resistance element in which a metal element used in the conductive film 22 is contained in the insulating film 23 instead of providing the conductive film 22, or the like. Also, it is possible to apply the drive method of the present invention to a storage device including a variable resistance element which has various configurations, besides the variable resistance element including the metal element which is easily ionized, and the insulating film.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A method of driving a storage device including a variable resistance element which includes a pair of electrodes, and in which a resistance value is reversibly changed by applying voltages having polarities different from each other between the pair of electrodes, the method comprising:

applying a first pulse voltage for a first time duration between the pair of electrodes causing the variable resistance element to change from a high resistance state in which a resistance value is high to a low resistance state in which a resistance value is low; and applying a second pulse voltage for a second time duration between the pair of electrodes after the first pulse voltage, the second pulse voltage having a different shape from the first pulse voltage and the second time duration ending after a temperature of a conductive path formed between the pair of electrodes decreases to a temperature threshold;

wherein the second pulse voltage has a voltage value that is lower than a voltage value of the first pulse voltage; and wherein the second pulse voltage is set to be off, after the temperature of the conductive path is substantially equal to a temperature of the conductive path prior to the application of the first pulse voltage.

2. The method of driving a storage device according to claim 1, wherein the variable resistance element comprises, between the pair of electrodes:
a storage layer composed of an insulator; and
a metal containing layer containing a metal element which is easily ionized.

3. The method of driving a storage device according to claim 2, wherein the metal element is at least one of copper (Cu), silver (Ag), and zinc (Zn).

4. The method of driving a storage device according to claim 1, wherein the pulse width of the first pulse voltage corresponds to the first time duration and the second pulse width of the second pulse voltage corresponds to the second time duration.

5. A method of driving a storage device including a variable resistance element which includes a pair of electrodes, and in which a resistance value is reversibly changed by applying voltages having polarities different from each other between the pair of electrodes, the method comprising:

applying a first pulse voltage for a first time duration between the pair of electrodes causing the variable resistance element to change from a high resistance state in which a resistance value is high to a low resistance state in which a resistance value is low; and applying a second pulse voltage for a second time duration between the pair of electrodes after the first pulse voltage, the second pulse voltage having a different shape from the first pulse voltage and the second time duration ending after a temperature of a conductive path formed between the pair of electrodes decreases to a temperature threshold;

wherein the second pulse voltage has a voltage value that is higher than a voltage value of the first pulse voltage.

6. The method of driving a storage device according to claim 5, wherein the variable resistance element comprises, between the pair of electrodes:
a storage layer composed of an insulator; and
a metal containing layer containing a metal element which is easily ionized.

7. The method of driving a storage device according to claim 6, wherein the metal element is at least one of copper (Cu), silver (Ag), and zinc (Zn).

8. The method of driving a storage device according to claim 5, wherein the pulse width of the first pulse voltage corresponds to the first time duration and the second pulse width of the second pulse voltage corresponds to the second time duration.

9. The method of driving a storage device according to claim 5, wherein
a pulse width of the second pulse voltage is set to be larger than a pulse width of the first pulse voltage.

10. A method of driving a storage device including a variable resistance element which includes a pair of electrodes, and in which a resistance value is reversibly changed by applying voltages having polarities different from each other between the pair of electrodes, the method comprising:

applying a first pulse voltage for a first time duration between the pair of electrodes causing the variable resistance element to change from a high resistance state in which a resistance value is high to a low resistance state in which a resistance value is low;

applying a second pulse voltage for a second time duration between the pair of electrodes after the first pulse voltage, the second pulse voltage having a different shape from the first pulse voltage and the second time duration ending after a temperature of a conductive path formed between the pair of electrodes decreases to a first temperature threshold; and applying a third pulse voltage for a third time duration between the pair of electrodes after the second pulse voltage, the third pulse voltage having a different shape from the first pulse voltage and the second pulse voltage and the third time duration ending after a temperature of a conductive path formed between the pair of electrodes decreases to a second temperature threshold.

11. The method of driving a storage device according to claim 10, wherein the second temperature threshold is lower than the first temperature threshold.

12. The method of driving a storage device according to claim 10, wherein the variable resistance element comprises, between the pair of electrodes:
a storage layer composed of an insulator; and
a metal containing layer containing a metal element which is easily ionized.

13. The method of driving a storage device according to claim 12, wherein the metal element is at least one of copper (Cu), silver (Ag), and zinc (Zn).

14. The method of driving a storage device according to claim 10, wherein the pulse width of the first pulse voltage corresponds to the first time duration and the second pulse width of the second pulse voltage corresponds to the second time duration.

* * * * *